United States Patent
Yoo et al.

(10) Patent No.: US 9,305,919 B2
(45) Date of Patent: Apr. 5, 2016

(54) SEMICONDUCTOR DEVICES INCLUDING CELL-TYPE POWER DECOUPLING CAPACITORS

(71) Applicant: Samsung Electronics Co., Ltd., Suwon-si, Gyeonggi-do (KR)

(72) Inventors: Han-Sik Yoo, Seoul (KR); Se-Il Oh, Incheon (KR)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 13/792,867

(22) Filed: Mar. 11, 2013

(65) Prior Publication Data
US 2013/0256832 A1 Oct. 3, 2013

(30) Foreign Application Priority Data
Apr. 2, 2012 (KR) .................. 10-2012-0033937

(51) Int. Cl.
*H01L 27/13* (2006.01)
*H01L 27/08* (2006.01)
*H01L 27/04* (2006.01)
*H01L 49/02* (2006.01)

(52) U.S. Cl.
CPC ............ *H01L 27/0805* (2013.01); *H01L 27/04* (2013.01); *H01L 28/90* (2013.01)

(58) Field of Classification Search
CPC ...... H01L 27/08; H01L 27/0805; H01L 27/04
See application file for complete search history.

(56) References Cited

U.S. PATENT DOCUMENTS

| 5,304,506 | A | * | 4/1994 | Porter et al. | 438/394 |
| 5,739,576 | A | | 4/1998 | Shirley et al. | |
| 7,462,912 | B2 | | 12/2008 | Ahn et al. | |
| 7,999,299 | B2 | | 8/2011 | Lee et al. | |
| 8,436,408 | B2 | * | 5/2013 | Tu et al. | 257/300 |
| 2004/0195621 | A1 | | 10/2004 | Nasr | |
| 2008/0035977 | A1 | | 2/2008 | Edward et al. | |
| 2009/0065837 | A1 | * | 3/2009 | Lee et al. | 257/296 |
| 2010/0146470 | A1 | * | 6/2010 | Kousaki | 716/10 |
| 2011/0316119 | A1 | * | 12/2011 | Kim et al. | 257/532 |

FOREIGN PATENT DOCUMENTS

| KR | 10-2006-0134579 A | 12/2006 |
| KR | 10-2009-0043940 A | 5/2009 |

* cited by examiner

*Primary Examiner* — Evan Pert
(74) *Attorney, Agent, or Firm* — Myers Bigel & Sibley, P.A.

(57) ABSTRACT

A semiconductor device includes an internal circuit and a cell-type power decoupling capacitor. The cell-type power decoupling capacitor is formed on a semiconductor substrate using a stack cell capacitor process. The cell-type power decoupling capacitor stabilizes a supply voltage to provide the stabilized supply voltage to the internal circuit. Accordingly, the semiconductor device including the cell-type power decoupling capacitor may be insensitive to power noise and may occupy a small area on a chip.

18 Claims, 13 Drawing Sheets

SEMICONDUCTOR DEVICES INCLUDING CELL-TYPE POWER DECOUPLING CAPACITORS

CROSS-REFERENCE TO RELATED APPLICATION

This application claims priority under 35 U.S.C. §119 to Korean Patent Application No. 10-2012-0033937 filed on Apr. 2, 2012, the entire contents of which are hereby incorporated herein by reference in their entirety.

BACKGROUND

Embodiments of the inventive concepts relate to semiconductor devices and, more particularly, to semiconductor devices including power decoupling capacitors.

In a semiconductor device, such as a semiconductor memory device, a power decoupling capacitor may be employed to stabilize a supply voltage used in an internal circuit. The lower the operating voltage and the more precise the fabrication process, the more important the power decoupling capacitor may become.

SUMMARY

Embodiments of the inventive concepts may provide a semiconductor device including a cell-type power decoupling capacitor which can be insensitive to power noise and can occupy a small area of a chip.

Embodiments of the inventive concepts also may provide a layout method of a cell-type power decoupling capacitor of a semiconductor device, which may be insensitive to power noise and may occupy a small area of a chip.

The technical objectives of the inventive concepts are not limited to the above disclosure; other objectives may become apparent to those of ordinary skill in the art based on the following descriptions.

In accordance with an aspect of the inventive concepts, a semiconductor device includes an internal circuit and a cell-type power decoupling capacitor. The semiconductor device may comprise a semiconductor memory device.

The cell-type power decoupling capacitor is formed on a semiconductor substrate using a stack cell capacitor process. The cell-type power decoupling capacitor stabilizes a supply voltage to provide the stabilized supply voltage to the internal circuit.

In some embodiments, the cell-type power decoupling capacitor may include a first conductive layer, a second conductive layer, and a dielectric layer.

The first conductive layer is connected to a high supply voltage. The second conductive layer is connected to a low supply voltage, and separated from the first conductive layer. The dielectric layer is disposed between the first conductive layer and the second conductive layer. The cell-type power decoupling capacitor is formed on the semiconductor substrate.

In other embodiments, the first conductive layer and the second conductive layer may include poly-silicon layers.

In still other embodiments, the dielectric layer may include an oxide layer.

In yet other embodiments, the second conductive layer may have a U-shape structure.

In yet other embodiments, the cell-type power decoupling capacitor may be formed on an active layer disposed in the semiconductor substrate.

In yet other embodiments, the cell-type power decoupling capacitor may be formed on a resistor area which is formed using an active layer disposed in the semiconductor substrate.

In yet other embodiments, the cell-type power decoupling capacitor may be formed on a resistor area which is formed using a poly-silicon layer disposed in the semiconductor substrate.

In yet other embodiments, the cell-type power decoupling capacitor may be formed on an N-type well or a P-type well. The N-type well or the P-type well are disposed in the semiconductor substrate.

In yet other embodiments, the cell-type power decoupling capacitor may be formed on areas between CMOS transistor arrays.

In yet other embodiments, the cell-type power decoupling capacitor may be formed on areas between at least two adjacent CMOS transistor arrays.

In yet other embodiments, the cell-type power decoupling capacitor may be formed on areas between every N CMOS transistor arrays, wherein N is an integer equal to or larger than two.

In yet other embodiments, the cell-type power decoupling capacitor may be formed on a poly-silicon layer that forms a pumping capacitor included in the semiconductor memory device.

In yet other embodiments, the semiconductor device may be a stack memory device in which a plurality of chips configured to transmit and receive data and control signals through through-silicon-vias (TSVs) are stacked.

Therefore, the semiconductor device including a cell-type power decoupling capacitor according to embodiments of the inventive concepts is formed on a semiconductor substrate using a stack cell capacitor process, and stabilizes a supply voltage to provide the stabilized supply voltage to an internal circuit. The cell-type power decoupling capacitor of the semiconductor memory device may be disposed on an active resistor, on an N-well, on a P-well, on an area between arrays of CMOS transistors, under a metal fuse, under a pad metal, or on a pumping capacitor.

A semiconductor device according to yet other embodiments of the inventive concepts may comprise a substrate, a plurality of first circuit elements in the substrate, a plurality of power decoupling capacitor cells on the plurality of first circuit elements, remote from the substrate, and a plurality of second circuit elements on the plurality of power decoupling capacitor cells, remote from the plurality of first circuit elements. In some embodiments, the plurality of first circuit elements comprise a plurality of N-type transistors, a plurality of P-type transistors, a plurality of CMOS transistors, a plurality of resistors and/or a plurality of pumping capacitors. In yet other embodiments, the plurality of second circuit elements comprise a plurality of pads and/or a plurality of fuses. Moreover, the plurality of power decoupling capacitor cells may comprise a plurality of electrodes that extend along a face of the substrate and also extend orthogonal to the face of the substrate. In other embodiments, the plurality of power decoupling capacitor cells comprise first and second poly-silicon layers with a dielectric layer therebetween.

Accordingly, the semiconductor device including the cell-type power decoupling capacitor according to embodiments of the inventive concepts may be insensitive to power noise and may occupy a small area on a chip.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
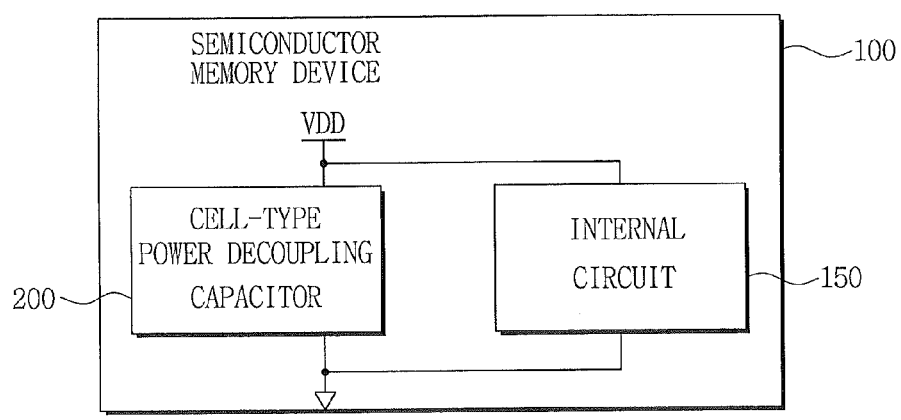
FIG. 1 is a block diagram of a semiconductor device including a cell-type power decoupling capacitor in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments are described herein with respect to semiconductor memory devices. However, it will be understood that various embodiments described herein may also be used in connection with semiconductor logic devices and other semiconductor integrated circuit devices. Moreover, various embodiments are described herein in connection with a semiconductor substrate. This semiconductor substrate may include single element and/or compound semiconductor bulk substrates, single element and/or compound semiconductor layers on non-semiconductor substrates and/or freestanding single element and/or compound semiconductor layers. Moreover, non-semiconductor substrates may also be used including, but not limited to, glass or sapphire substrates. Accordingly, any microelectronic substrate, generally referred to herein as simply a "substrate", may be used with various embodiments described herein.

FIG. 1 is a block diagram of a semiconductor memory device 100 including a cell-type power decoupling capacitor in accordance with embodiments of the inventive concepts.

Referring to FIG. 1, the semiconductor memory device 100 may include an internal circuit 150 and a cell-type power decoupling capacitor 200.

The cell-type power decoupling capacitor 200 is formed on a semiconductor substrate using a stack cell capacitor process. The cell-type power decoupling capacitor 200 stabilizes a supply voltage VDD to provide the stabilized supply voltage to the internal circuit 150. For example, the cell-type power decoupling capacitor 200 is connected between a high supply voltage VDD and a low supply voltage VSS, and stabilizes the supply voltage provided to the internal circuit 150 to improve noise characteristics of the semiconductor memory device 100.

Figure 2:
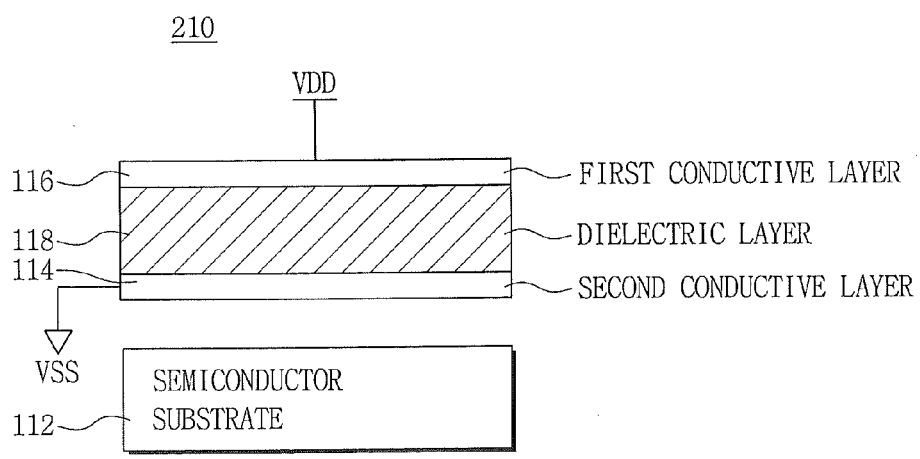
FIG. 2 is a cross-sectional view illustrating a vertical structure of the cell-type power decoupling capacitor included in the semiconductor device of FIG. 1, in accordance with embodiments of the inventive concepts.

FIG. 2 is a cross-sectional view illustrating a vertical structure of the cell-type power decoupling capacitor 200 included in the semiconductor memory device of FIG. 1, in accordance with embodiments of the inventive concepts.

Referring to FIG. 2, the cell-type power decoupling capacitor 210 may be formed on a semiconductor substrate 112, and may include a first conductive layer 116, a second conductive layer 114, and a dielectric layer 118. A high supply voltage VDD may be applied to the first conductive layer 116. The second conductive layer 114 is connected to a low supply voltage VSS, and may be separated from the first conductive layer 118 by a first distance. The dielectric layer 118 is disposed between the first conductive layer 116 and the second conductive layer 114. The cell-type power decoupling capacitor is formed on the semiconductor substrate.

Figure 3:
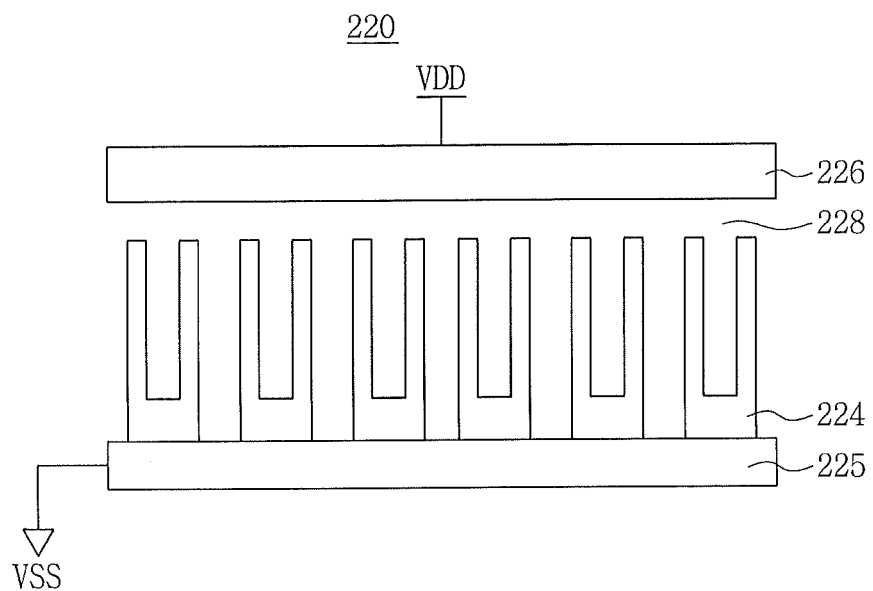
FIG. 3 is a cross-sectional view illustrating a vertical structure of the cell-type power decoupling capacitor included in the semiconductor device of FIG. 1, in accordance with other embodiments of the inventive concepts.
Figure 4:
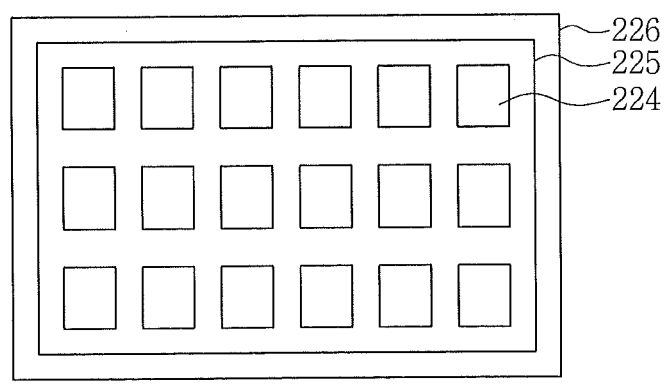
FIG. 4 is a plan view illustrating a horizontal structure of the cell-type power decoupling capacitor of FIG. 3, in accordance with embodiments of the inventive concepts.

FIG. 3 is a cross-sectional view illustrating a vertical structure of the cell-type power decoupling capacitor 200 included in the semiconductor memory device 100 of FIG. 1, and FIG. 4 is a plan view illustrating a horizontal structure of the cell-type power decoupling capacitor of FIG. 3.

Referring to FIG. 3, the cell-type power decoupling capacitor 220 may include a first conductive layer 226, a second conductive layer 224, a dielectric layer 228, and a conductive line 225 that is electrically connected to the second conductive layer 224. The second conductive layer 224 comprising the cell-type power decoupling capacitor 220 may have a U-shape structure. In FIG. 3, each of the first conductive layer 226 and the second conductive layer 224 may include a poly-silicon layer. Further, the dielectric layer 228 may include an oxide layer (such as $SiO_2$).

Figure 5:
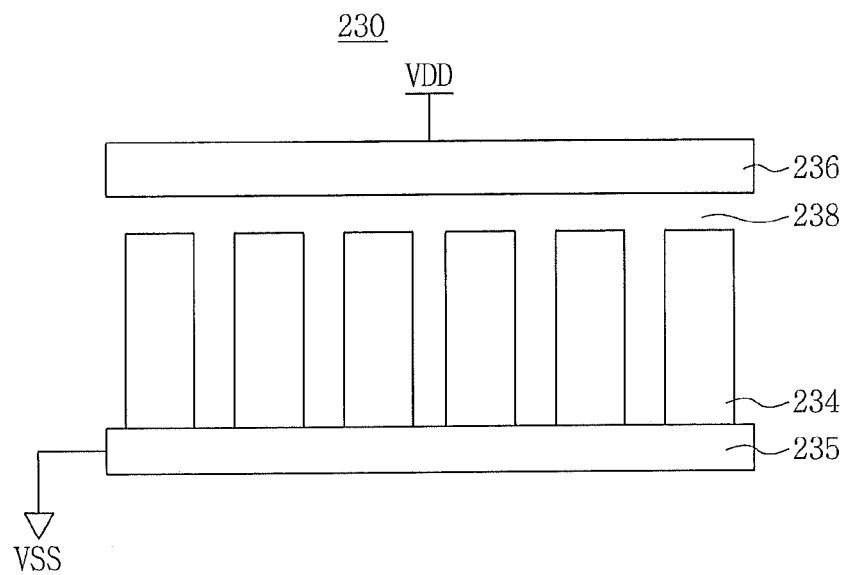
FIG. 5 is a cross-sectional view illustrating a vertical structure of the cell-type power decoupling capacitor included in the semiconductor device of FIG. 1, in accordance with still other embodiments of the inventive concepts.

FIG. 5 is a cross-sectional view illustrating a vertical structure of the cell-type power decoupling capacitor 200 included in the semiconductor memory device 100 of FIG. 1, in accordance with still other embodiments of the inventive concepts.

Referring to FIG. 5, the cell-type power decoupling capacitor 230 may include a first conductive layer 236, a second conductive layer 234, a dielectric layer 238, and a conductive line 235 that is electrically connected to the second conductive layer 234. The second conductive layer 234 comprising the cell-type power decoupling capacitor 230 may have a bar-shape structure. In FIG. 5, each of the first conductive layer 236 and the second conductive layer 234 may include a poly-silicon layer. Further, the dielectric layer 238 may include an oxide layer ($SiO_2$).

Figure 6:
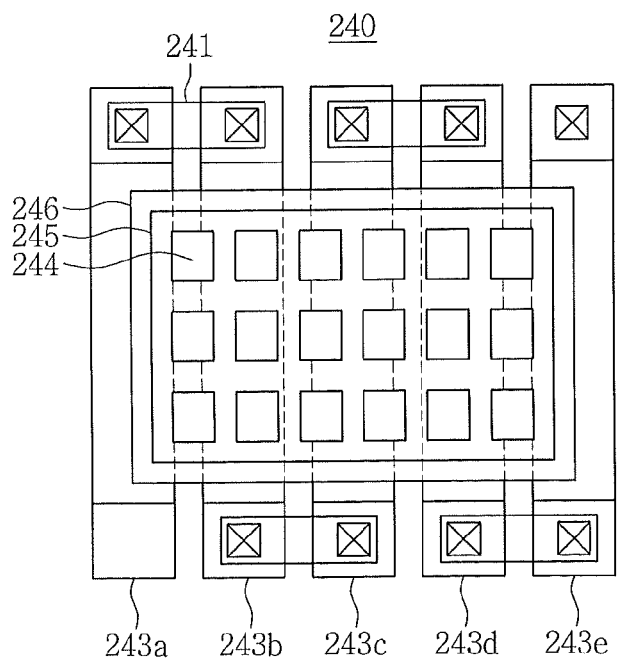
FIG. 6 is a layout diagram illustrating a horizontal structure of a semiconductor device including the cell-type power decoupling capacitor in FIG. 1, in accordance with embodiments of the inventive concepts.
Figure 7:
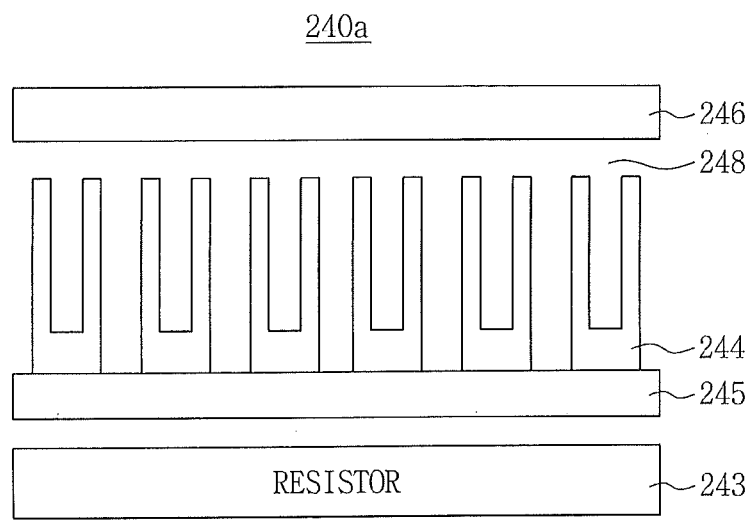
FIG. 7 is a cross-sectional view corresponding to the layout diagram of the semiconductor device of FIG. 6.

FIG. 6 is a layout diagram illustrating a horizontal structure of a semiconductor memory device 100 including the cell-type power decoupling capacitor in FIG. 1, and FIG. 7 is a cross-sectional view corresponding to the layout diagram of the semiconductor memory device of FIG. 6.

Referring to FIG. 6, the semiconductor memory device 240 may include a cell-type power decoupling capacitor that includes a first conductive layer 246, a second conductive layer 244, a dielectric layer 248, and a conductive line 245 that is electrically connected to the second conductive layer 244. The cell-type power decoupling capacitor is formed on the active resistor 243. In FIGS. 6 and 7, the second conductive layer 234 having a U-shape structure is shown as an example.

In FIG. 6, the active resistor 243 may have a structure in which pieces of active resistor 243a, 243b, 243c, 243d and 243e having a rectangular shape are electrically connected by a conductive line 241.

In FIGS. 6 and 7, cell-type power decoupling capacitors disposed on the active resistor 243 are shown, but the cell-type power decoupling capacitors may be disposed on a resistor area formed with a poly-silicon layer on a semiconductor substrate.

Further, in FIGS. 6 and 7, cell-type power decoupling capacitors disposed on the active resistor 243 are shown, but the cell-type power decoupling capacitors may be disposed on an active layer having active resistors and other active devices.

Figure 8:
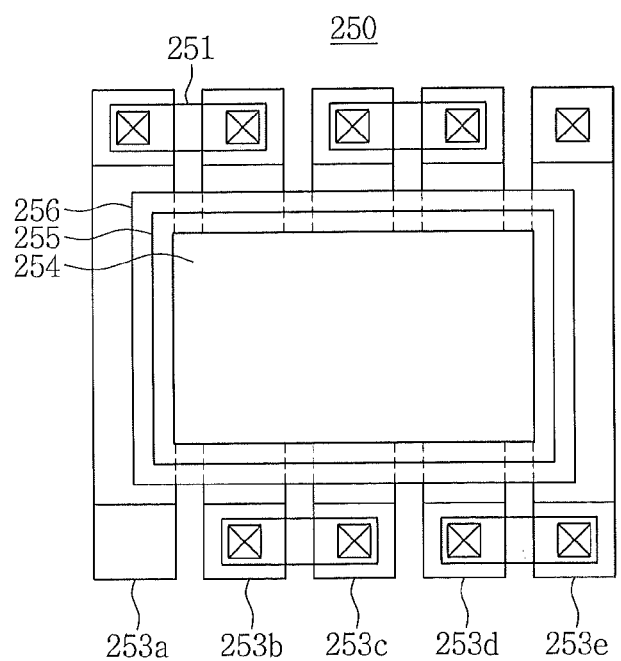
FIG. 8 is a layout diagram illustrating a horizontal structure of a semiconductor device including the cell-type power decoupling capacitor in FIG. 1, in accordance with other embodiments of the inventive concepts.

FIG. 8 is a layout diagram illustrating a horizontal structure of a semiconductor memory device 250 including the cell-type power decoupling capacitor in FIG. 1, in accordance with other embodiments of the inventive concepts. The semiconductor memory device 250 of FIG. 8 may include a cell-type power decoupling capacitor that includes a first conductive layer 256, a second conductive layer 254, a dielectric layer (not shown), and a conductive line 255 that is electrically connected to the second conductive layer 254. The cell-type power decoupling capacitor is formed on the active resistor 253. In FIGS. 6 and 7, the second conductive layer 254 having a bar-shape structure is shown as an example.

In FIG. 8, the active resistor 253 may have a structure in which pieces of active resistor 253a, 253b, 253c, 253d and 253e having a rectangular shape are electrically connected by a conductive line 251.

Figure 9:
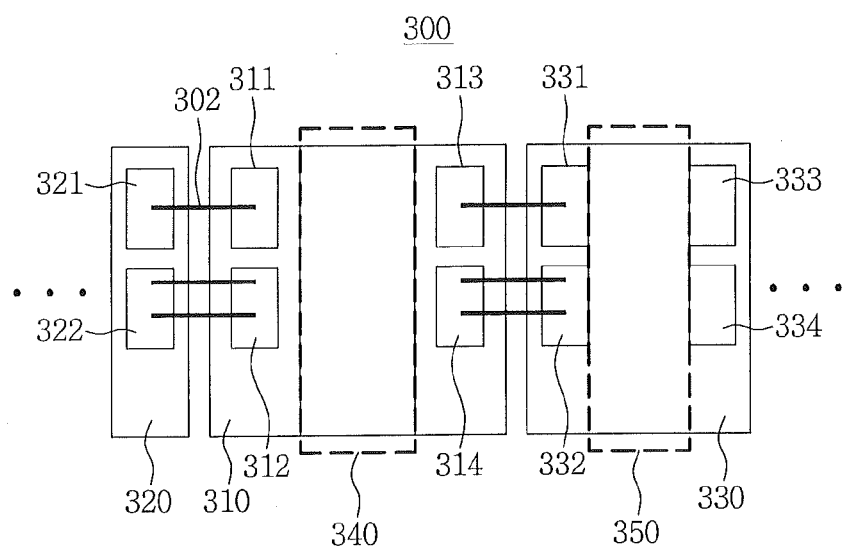
FIG. 9 is a layout diagram illustrating a horizontal structure of a semiconductor device including the cell-type power decoupling capacitor in FIG. 1, in accordance with still other embodiments of the inventive concepts.

FIG. 9 is a layout diagram illustrating a horizontal structure of a semiconductor memory device 300 including the cell-type power decoupling capacitor in FIG. 1, in accordance with still other embodiments of the inventive concepts.

Referring to FIG. 9, the semiconductor memory device 300 may include a plurality of N-wells 310, a plurality of P-wells 320 and 330, and a plurality of cell-type power decoupling capacitors 340 and 350. PMOS transistors 311, 312, 313 and 314 are formed in the N-well 310, NMOS transistors 321 and 322 are formed in the P-well 320, and NMOS transistors 331, 332, 333 and 334 are formed in the P-well 330. PMOS transistors 311, 312, 313 and 314 formed in the N-well 310, and NMOS transistors 331, 332, 333 and 334 formed in the P-well 330 may be electrically connected through conductive lines 302.

The cell-type power decoupling capacitors 340 may be formed on an area in which the PMOS transistors 311, 312, 313 and 314 are not formed in the N-well 310. The cell-type power decoupling capacitors 350 may be formed on an area in which the NMOS transistors 331, 332, 333 and 334 are not formed in the P-well 330.

Figure 10:
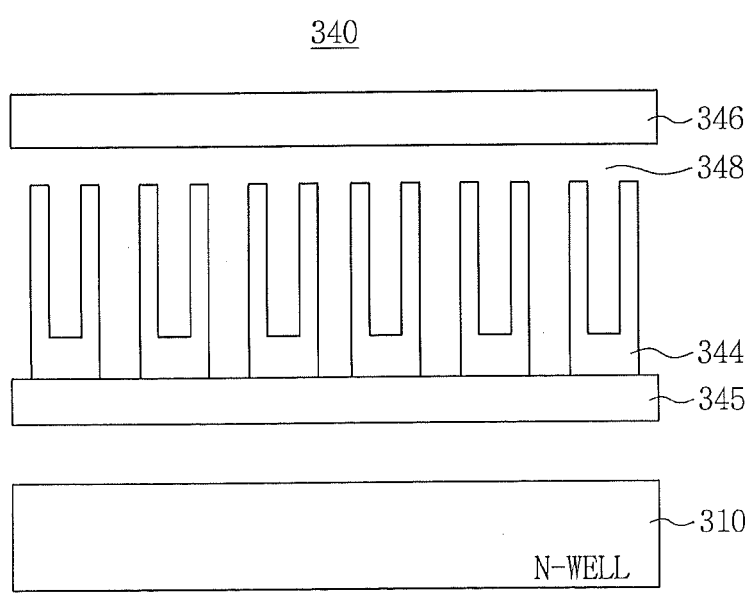
FIGS. 10 and 11 are cross-sectional views illustrating vertical structures of the cell-type power decoupling capacitors included in the semiconductor device of FIG. 9, in accordance with embodiments of the inventive concepts.
Figure 11:
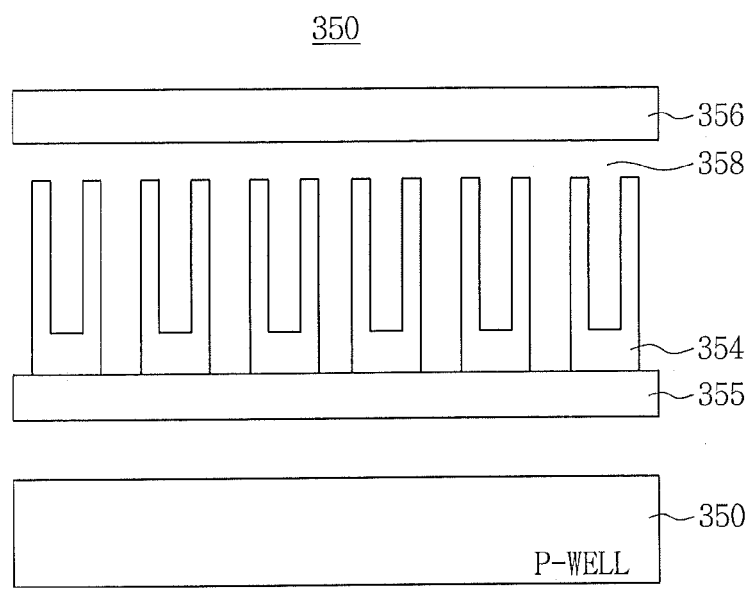

FIGS. 10 and 11 are cross-sectional views illustrating vertical structures of the cell-type power decoupling capacitors included in the semiconductor memory device 300 of FIG. 9, in accordance with embodiments of the inventive concepts.

Referring to FIG. 10, the cell-type power decoupling capacitor 340 may include a first conductive layer 346, a second conductive layer 344, a dielectric layer 348, and a conductive line 345 that is electrically connected to the second conductive layer 344. The cell-type power decoupling capacitor 340 is formed on the N-well 310. The cell-type power decoupling capacitor 340 of FIG. 10 may have a U-shape structure.

Referring to FIG. 11, the cell-type power decoupling capacitor 350 may include a first conductive layer 356, a second conductive layer 354, a dielectric layer 358, and a conductive line 355 that is electrically connected to the second conductive layer 354. The cell-type power decoupling capacitor 350 is formed on the P-well 330. The cell-type power decoupling capacitor 330 of FIG. 11 may have a U-shape structure.

Figure 12:
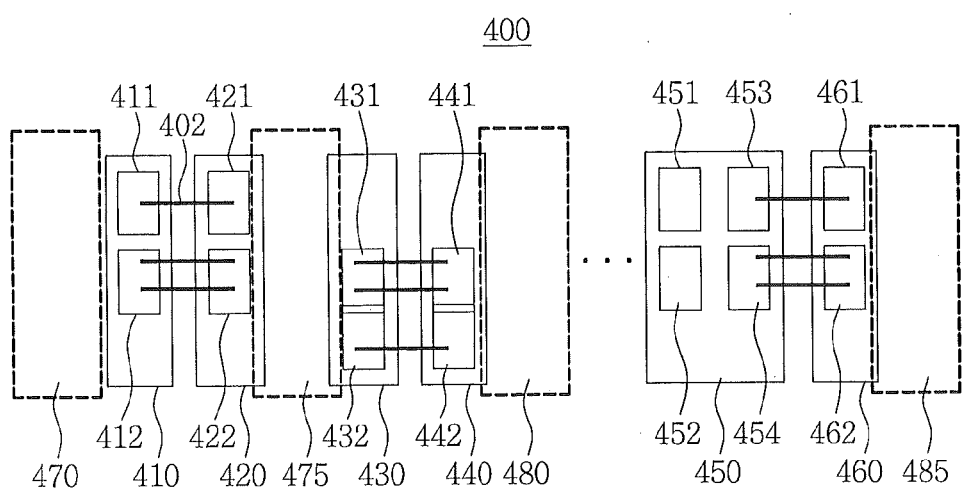
FIG. 12 is a layout diagram illustrating a horizontal structure of a semiconductor device including the cell-type power decoupling capacitor in FIG. 1, in accordance with still other embodiments of the inventive concepts.

FIG. 12 is a layout diagram illustrating a horizontal structure of a semiconductor memory device including the cell-type power decoupling capacitor in FIG. 1, in accordance with still other embodiments of the inventive concepts.

Referring to FIG. 12, the semiconductor memory device 400 may include a plurality of CMOS transistors. Each of the NMOS transistors 411 and 412 formed in the P-well 410 and each of the PMOS transistors 421 and 422 formed in the N-well 420 may comprise a CMOS transistor. Each of the PMOS transistors 431 and 432 formed in the N-well 430 and each of the NMOS transistors 441 and 442 formed in the P-well 440 may comprise a CMOS transistor. Each of the PMOS transistors 453 and 454 formed in the N-well 450 and each of the NMOS transistors 461 and 462 formed in the P-well 460 may comprise a CMOS transistor. Each of the PMOS transistors 451 and 452 formed in the N-well 450 and each of the NMOS transistors formed in the former P-well (not shown) may comprise a CMOS transistor. PMOS transistors formed in the N-well and NMOS transistors formed in the P-well may be electrically connected through a conductive line 402.

As shown in FIG. 12, the cell-type power decoupling capacitor areas 470, 475; 480 and 485 may be formed on areas between two adjacent CMOS transistor arrays.

Figure 13:
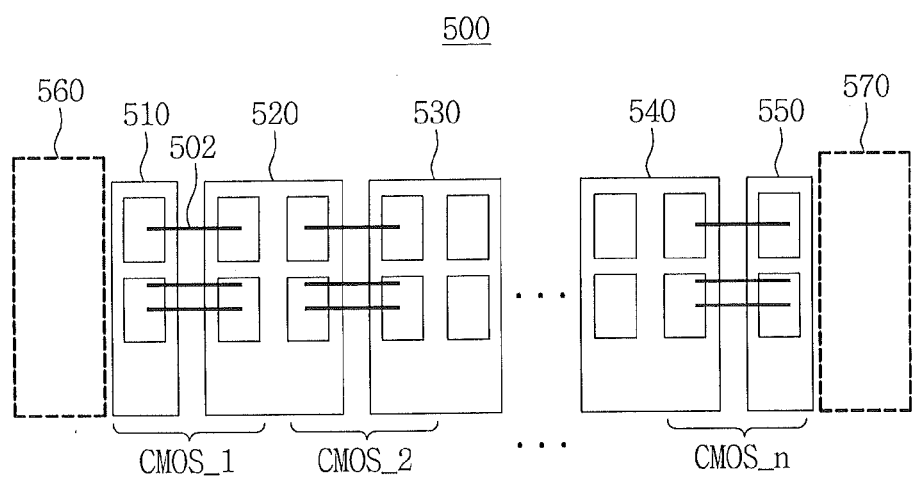
FIG. 13 is a layout diagram illustrating a horizontal structure of a semiconductor device including the cell-type power decoupling capacitor in FIG. 1, in accordance with yet other embodiments of the inventive concepts.

FIG. 13 is a layout diagram illustrating a horizontal structure of a semiconductor memory device including the cell-type power decoupling capacitor in FIG. 1, in accordance with yet other embodiments of the inventive concepts.

Referring to FIG. 13, the semiconductor memory device 500 may include a plurality of CMOS transistors. NMOS transistors formed in the P-well 510 and PMOS transistors formed in the N-well 520 may comprise a CMOS transistor. PMOS transistors formed in the N-well 520 and NMOS transistors formed in the P-well 530 may comprise a CMOS transistor. PMOS transistors formed in the N-well 540 and NMOS transistors formed in the P-well 550 may comprise a CMOS transistor. PMOS transistors formed in the N-well and NMOS transistors formed in the P-well may be electrically connected through a conductive line 502.

As shown in FIG. 13, the cell-type power decoupling capacitor areas 560 and 570 may be formed on areas between every N CMOS transistor arrays among CMOS transistor arrays CMOS_1, CMOS_2, . . . , CMOS_n, wherein N is an integer equal to or larger than two.

Figure 14:
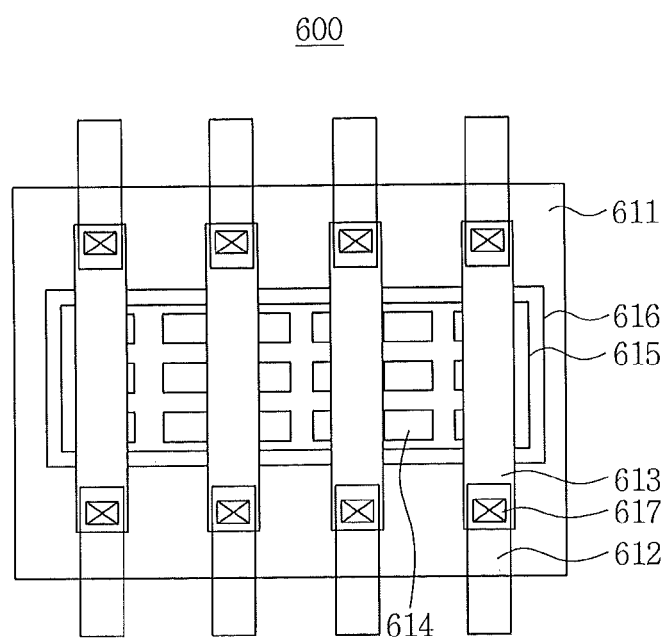
FIG. 14 is a layout diagram illustrating a horizontal structure of a semiconductor device including the cell-type power decoupling capacitor in FIG. 1, in accordance with yet other embodiments of the inventive concepts.
Figure 15:
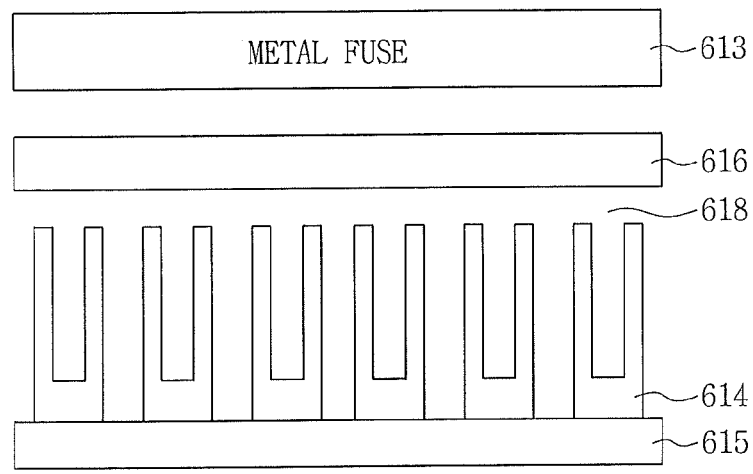
FIG. 15 is a cross-sectional view corresponding to the layout diagram of the semiconductor device of FIG. 14.

FIG. 14 is a layout diagram illustrating a horizontal structure of a semiconductor memory device including the cell-type power decoupling capacitor in FIG. 1, in accordance with yet other embodiments of the inventive concepts, and FIG. 15 is a cross-sectional view corresponding to the layout diagram of the semiconductor memory device of FIG. 14.

Referring to FIG. 14, the semiconductor memory device 600 may include a cell-type power decoupling capacitor that includes a first conductive layer 616, a second conductive layer 614, a dielectric layer 618, and a conductive line 615 that is electrically connected to the second conductive layer 614. The cell-type power decoupling capacitor is formed under a metal fuse 613. In FIGS. 14 and 15, the second conductive layer 614 having a U-shape structure is shown as an example. The reference number 611 in FIG. 14 may be a semiconductor substrate, or a P-well or an N-well formed on the semiconductor substrate.

Figure 16:
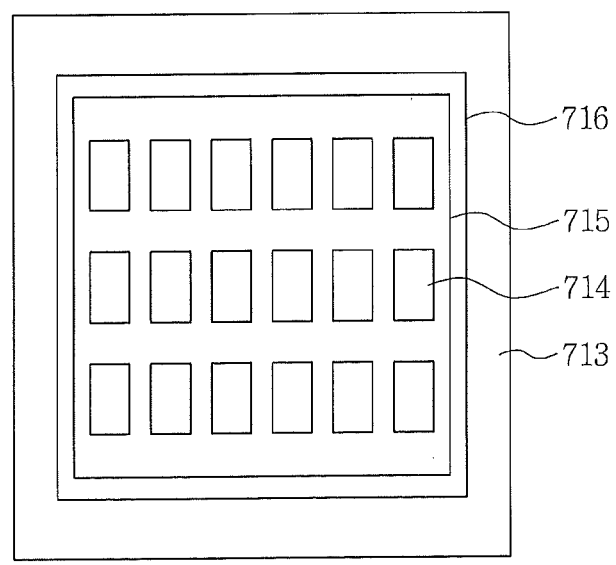
FIG. 16 is a layout diagram illustrating a horizontal structure of a semiconductor device including the cell-type power decoupling capacitor in FIG. 1, in accordance with yet other embodiments of the inventive concepts.
Figure 17:
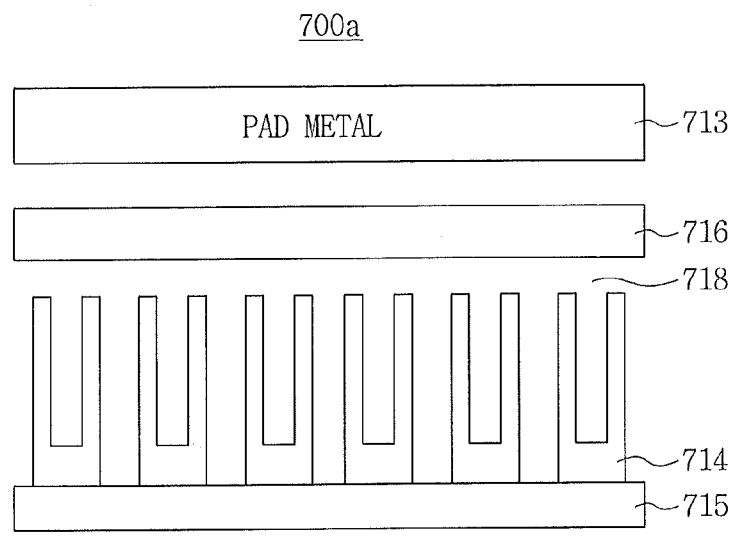
FIG. 17 is a cross-sectional view corresponding to the layout diagram of the semiconductor device of FIG. 16.

FIG. 16 is a layout diagram illustrating a horizontal structure of a semiconductor memory device including the cell-type power decoupling capacitor in FIG. 1, in accordance with yet other embodiments of the inventive concepts, and FIG. 17 is a cross-sectional view corresponding to the layout diagram of the semiconductor memory device of FIG. 16.

Referring to FIGS. 16 and 17, the semiconductor memory device 700 may include a cell-type power decoupling capacitor that includes a first conductive layer 716, a second conductive layer 714, a dielectric layer 718, and a conductive line 715 that is electrically connected to the second conductive layer 714. The cell-type power decoupling capacitor is formed under a pad metal 713. In FIGS. 16 and 17, the second conductive layer 714 having a U-shape structure is shown as an example.

Figure 18:
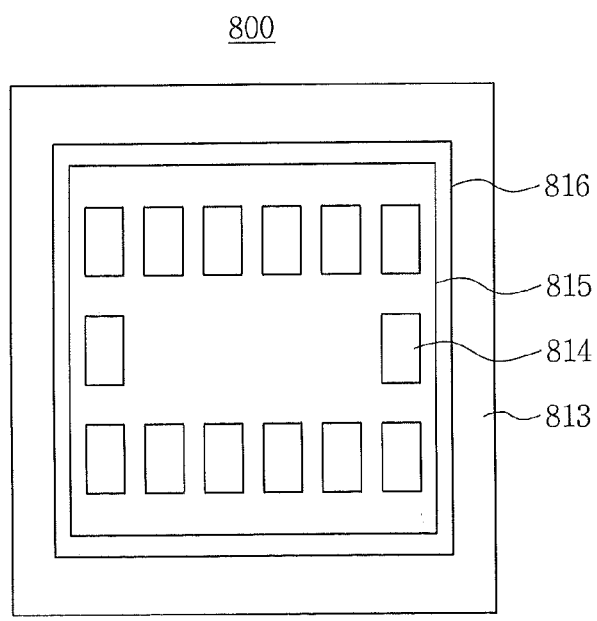
FIG. 18 is a layout diagram illustrating a horizontal structure of a semiconductor device including the cell-type power decoupling capacitor in FIG. 1, in accordance with yet other embodiments of the inventive concepts.

FIG. 18 is a layout diagram illustrating a horizontal structure of a semiconductor memory device including the cell-type power decoupling capacitor in FIG. 1, in accordance with yet other embodiments of the inventive concepts.

Referring to FIG. 18, the semiconductor memory device 800 may include a cell-type power decoupling capacitor that includes a first conductive layer 816, a second conductive layer 814, and a conductive line 815 that is electrically connected to the second conductive layer 814. The cell-type power decoupling capacitor is formed under a pad metal 813. The second conductive layer 814 of the cell-type power decoupling capacitor in FIG. 18 has a ring-shape horizontal structure. When the second conductive layer 814 of the cell-type power decoupling capacitor has the ring-shape horizontal structure, the semiconductor memory device 800 including the cell-type power decoupling capacitor may be less sensitive to external impact.

Figure 19:
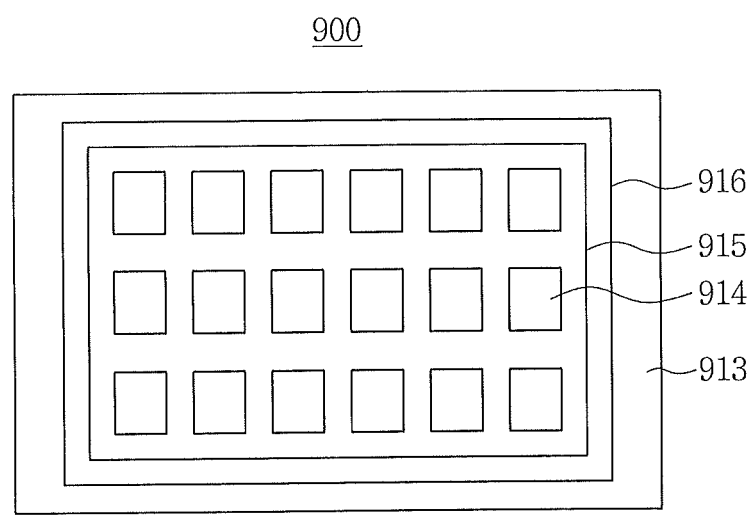
FIG. 19 is a layout diagram illustrating a horizontal structure of a semiconductor device including the cell-type power decoupling capacitor in FIG. 1, in accordance with yet other embodiments of the inventive concepts.
Figure 20:
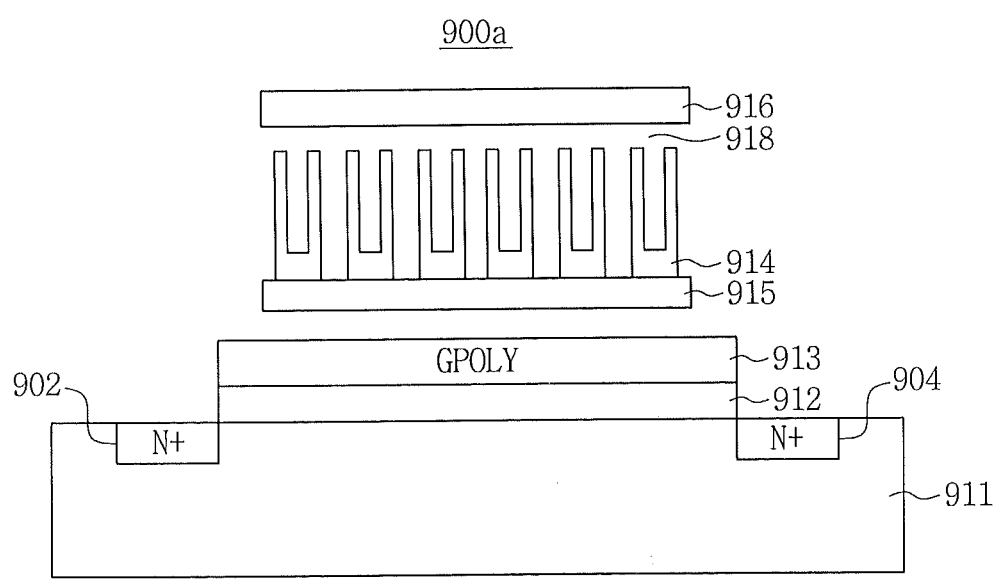
FIG. 20 is a cross-sectional view corresponding to the layout diagram of the device of FIG. 19.

FIG. 19 is a layout diagram 900 illustrating a horizontal structure of a semiconductor memory device including the cell-type power decoupling capacitor in FIG. 1, in accordance with yet other embodiments of the inventive concepts, and FIG. 20 is a cross-sectional view 900a corresponding to the layout diagram of the semiconductor memory device of FIG. 19.

Referring to FIGS. 19 and 20, the semiconductor memory device 900 or 900a may include a cell-type power decoupling capacitor that includes a first conductive layer 916, a second conductive layer 914, a dielectric layer 918, and a conductive line 915 that is electrically connected to the second conductive layer 914. The cell-type power decoupling capacitor is formed on a pumping capacitor. In FIGS. 19 and 20, the second conductive layer 914 having a U-shape structure is shown as an example. Because high reliability is required for a pumping capacitor used in a semiconductor memory device, a MOS capacitor formed between the gate terminal 913 and the source-drain region 902 and 904 may be used as the pumping capacitor. The MOS capacitor may use a gate oxide as a dielectric layer. The source region 902 and the drain region 904 may be formed using an N+ layer, and may be formed in the semiconductor substrate 911.

The semiconductor memory device 100 of FIG. 1 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 21:
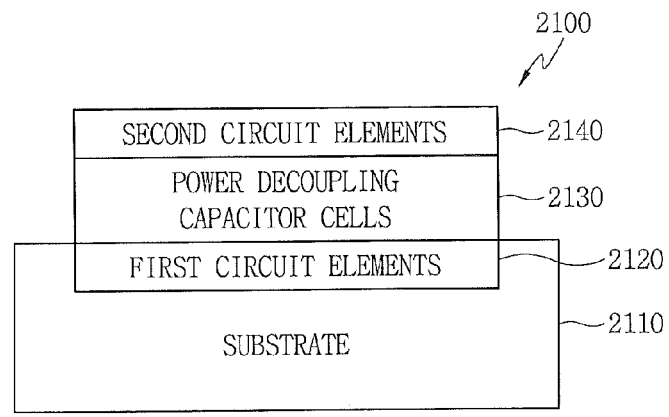
FIG. 21 is a cross-sectional view of a semiconductor device according to still other embodiments of the inventive concepts.

FIG. 21 is a cross-sectional view of a semiconductor device according to yet other embodiments of the inventive concepts. Referring to FIG. 21, the semiconductor device 2100, which may, in some embodiments, be a semiconductor memory device, comprise a substrate 2110, a plurality of first circuit elements 2120 in the substrate 2110, a plurality of power decoupling capacitor cells 2130 on the plurality of first circuit elements 2120, remote from the substrate 2110, and a plurality of second circuit elements 2140 on the plurality of power decoupling capacitor cells 2130, remote from the plurality of first circuit elements 2120.

The plurality of first circuit elements 2120 may comprise any of the circuit elements that were described above and/or other circuit elements, including a plurality of N-type transistors, plurality of P-type transistors, a plurality of CMOS transistors, a plurality of resistors and/or a plurality of pumping capacitors. The plurality of second circuit elements 2140 may include any of the upper circuit elements described above and/or other circuit elements, including a plurality of pads and/or a plurality of fuses.

Finally, the power decoupling capacitor cells 2130 may comprise a plurality of electrodes that extend along a face of the substrate and also extend orthogonal to the face of the substrate. In other embodiments, the plurality of power decoupling capacitor cells 2130 comprise first and second poly-silicon layers with a dielectric layer therebetween.

Figure 22:
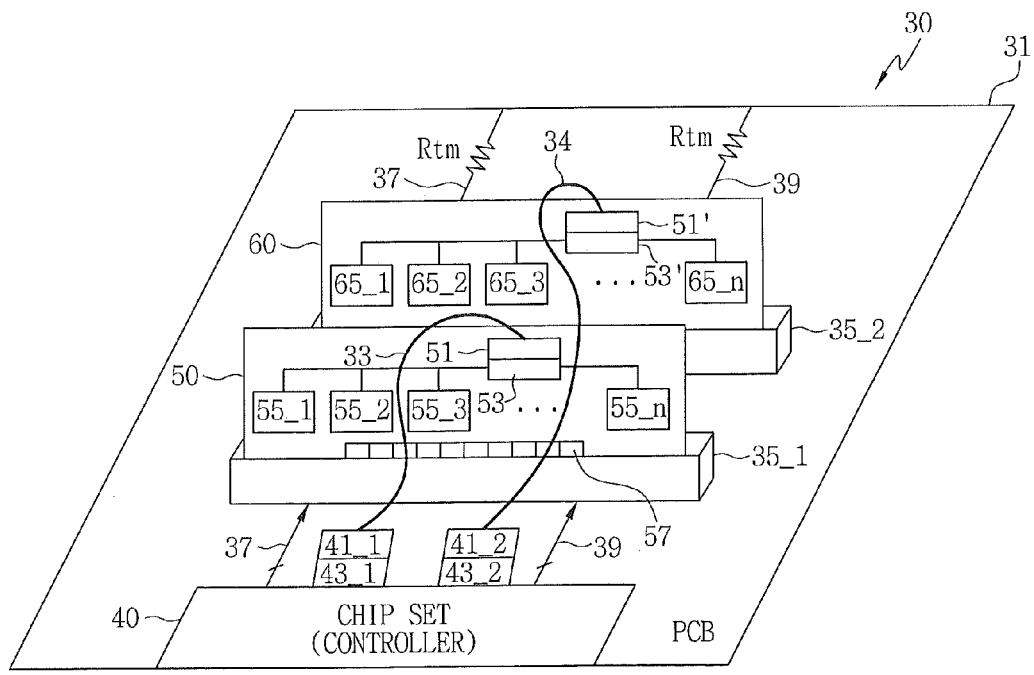
FIG. 22 is a diagram of an example of a memory system including a semiconductor device in accordance with embodiments of the inventive concepts.

FIG. 22 is a diagram of an example of a memory system 30 including a semiconductor memory device in accordance with embodiments of the inventive concepts.

Referring to FIG. 22, the memory system 30 may include a motherboard 31, a chip set (or a controller) 40, slots 35_1 and 352, memory modules 50 and 60, and transmission lines 33 and 34. Buses 37 and 39 connect the chip set 40 with the slots 35_1 and 35_2. A terminal resistor Rtm may terminate each of the buses 37 and 39 on a PCB of the motherboard 31.

For convenience, in FIG. 22, only two slots 35_1 and 35_2 and two memory modules 50 and 60 are shown. However, the memory system 30 may include an arbitrary number of slots and memory modules.

The chip set 40 may be mounted on the PCB of the motherboard 31, and control the operation of the memory system 30. The chip set 40 may include connectors 41_1 and 41_2 and converters 43_1 and 43_2.

The converter 43_1 receives parallel data generated by the chip set 40, converts the parallel data to serial data, and outputs the serial data to the transmission line 33 via the connector 41_1. The converter 43_1 receives serial data via the transmission line 33, converts the serial data to parallel data, and outputs the parallel data to the chip set 40.

The converter 43_2 receives parallel data generated by the chip set 40, converts the parallel data to serial data, and outputs the serial data to the transmission line 34 via the connector 41_2. The converter 43_2 receives serial data via the transmission line 34, converts the serial data to parallel data, and outputs the parallel data to the chip set 40. The transmission lines 33 and 34 included in the memory system 30 may be a plurality of optical fibers.

The memory module 50 may include a plurality of memory devices 55_1 to 55_n, a first connector 57, a second connector 51, and a converter 53. The memory module 60 may include a plurality of memory devices 65_1 to 65_n, a first connector 57', a second connector 51', and a converter 53'.

The first connector 57 may transfer low-speed signals received from the chip set 40 to the memory devices 55_1 to 55_n, and the second connector 51 may be connected to the transmission line 33 for transferring high-speed signals.

The converter 53 receives serial data via the second connector 51, converts the serial data to parallel data, and outputs the parallel data to the memory devices 55_1 to 55_n. Further, the converter 53 receives parallel data from the memory devices 55_1 to 55_n, converts the parallel data to serial data, and outputs the serial data to the second connector 51.

The memory devices 55_1 to 55n and 65_1 to 65_n may include a semiconductor memory device according to embodiments of the inventive concepts. Therefore, the memory devices 55_1 to 55_n and 65_1 to 65_n may include the cell-type power decoupling capacitor in accordance with the embodiments as described above.

The memory devices 55_1 to 55_n and 65_1 to 65_n may be a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 23:
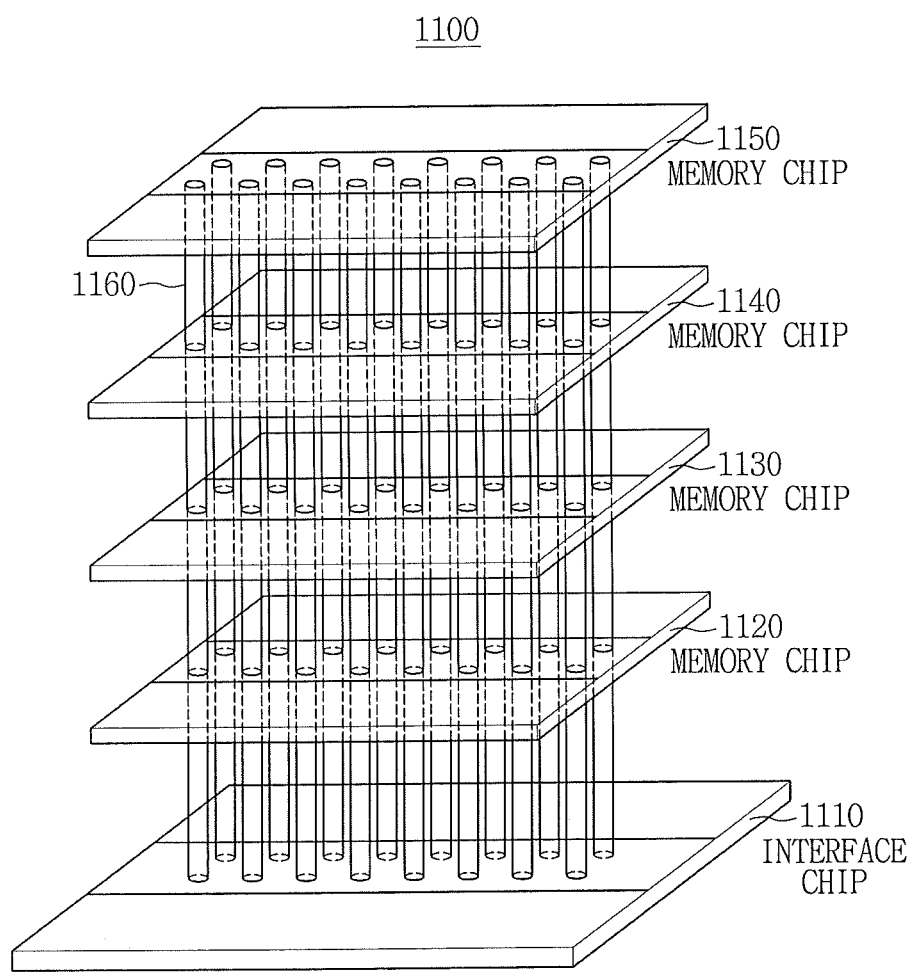
FIG. 23 is a diagram of an example of a stacked semiconductor device including a semiconductor device in accordance with embodiments of the inventive concepts.

FIG. 23 is a diagram of an example of a stacked semiconductor device 1100 including a semiconductor memory device according to embodiments of the inventive concepts.

Referring to FIG. 23, the stacked semiconductor device 1100 may include an interface chip 1110, and memory chips 1120, 1130, 1140 and 1150 which are electrically connected through through-silicon-vias 1160. Although the through-silicon-vias 1160 disposed in two rows are shown in FIG. 23, the stack semiconductor device 1100 may include any number of through-silicon-vias.

The memory chips 1120, 1130, 1140 and 1150 included in the stacked semiconductor device 1100 may include the cell-type power decoupling capacitor in accordance with the embodiments as described above. The interface chip 1110 may serve as an interface between the memory chips 1120, 1130, 1140 and 1150 and external devices.

Figure 24:
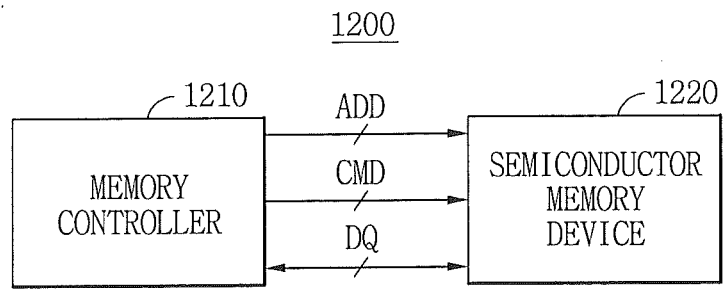
FIG. 24 is a block diagram of another example of a memory system including a semiconductor device in accordance with embodiments of the inventive concepts.

FIG. 24 is a block diagram of another example of a memory system 1200 including a semiconductor memory device in accordance with embodiments of the inventive concepts.

Referring to FIG. 24, the memory system 1200 includes a memory controller 1210 and a semiconductor memory device 1220.

The memory controller 1210 generates address signals ADD and command signals CMD, and provides the address signals ADD and the command signals CMD to the semiconductor memory device 1220 through buses. Data DQ may be transmitted from the memory controller 1210 to the semiconductor memory device 1220 through the buses, or transmitted from the stacked semiconductor memory device 1220 to the memory controller 1210 through the buses.

The semiconductor memory device 1220 may be a semiconductor memory device including the cell-type power decoupling capacitor in accordance with the embodiments as described above.

Figure 25:
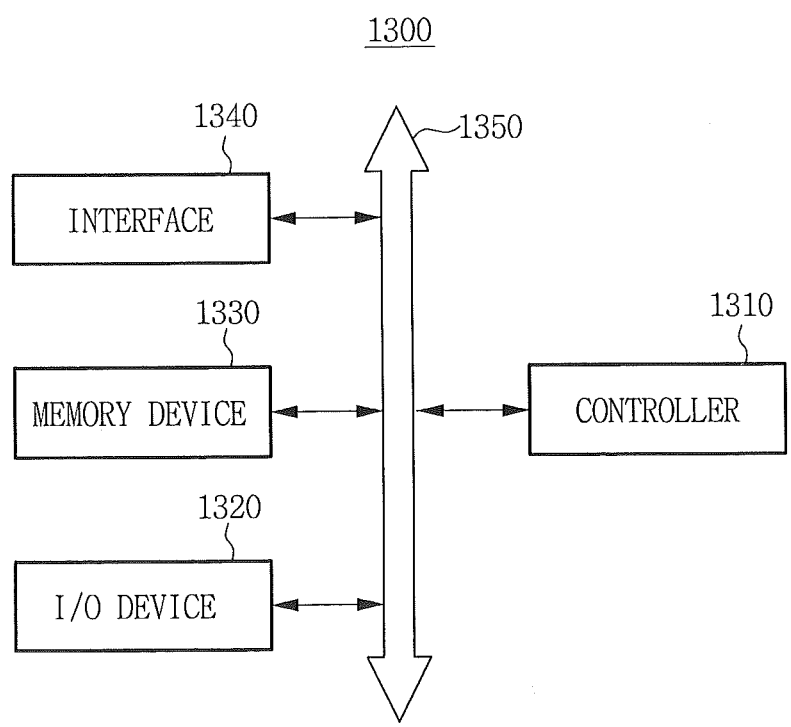
FIG. 25 is a block diagram of an example of an electronic system including a semiconductor device in accordance with embodiments of the inventive concepts.

FIG. 25 is a block diagram of an example of an electronic system 1300 including a semiconductor memory device in accordance with embodiments of the inventive concept.

Referring to FIG. 25, the electronic system 1300 in accordance with embodiment may include a controller 1310, an input and output device 1320, a memory device 1330, an interface 1340, and a bus 1350. The memory device 1330 may be a semiconductor memory device including the cell-type power decoupling capacitor in accordance with embodiments of the inventive concept. The bus 1350 may function to provide a path in which data is mutually moved among the controller 1310, the input and output device 1320, the memory device 1330, and the interface 1340.

The controller 1310 may include any one of logic devices that can perform functions of at least one of a microprocessor, a digital signal processor, and a microcontroller, or functions similar to those. The input and output device 1320 may include at least one selected from a key pad, key board, and a display device. The memory device 1330 may function to store data and/or instructions performed by the controller 1310.

The memory device 1330 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

The interface 1340 may function to transmit/receive data to/from a communication network. The interface 1340 may include an antenna, wired or wireless transceivers or the like to transmit and receive data by wires or wirelessly. In addition, the interface 1340 may include optical fibers to transmit and receive data through the optical fibers. The electronic system 2300 may be further provided with an application chipset, a camera image processor, and an input and output device.

The electronic system 1300 may be implemented as a mobile system, personal computer, an industrial computer, or a logic system that can perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 1300 is an apparatus that can perform wireless communication, the electronic system 1300 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
    a substrate;
    an internal circuit in the substrate; and
    a cell-type power decoupling capacitor on the internal circuit, the cell-type power decoupling capacitor stabilizing a supply voltage to provide the stabilized supply voltage to the internal circuit;
    wherein the cell-type power decoupling capacitor comprises:
    a first conductive layer connected to a first supply voltage;
    a second conductive layer connected to a second supply voltage that is lower than the first supply voltage, and separated from the first conductive layer; and
    a dielectric layer disposed between the first conductive layer and the second conductive layer,
    wherein the cell-type power decoupling capacitor is on a metal-oxide-semiconductor field-effect transistor (MOSFET).

2. The semiconductor device according to claim 1, wherein the first conductive layer and the second conductive layer comprise poly-silicon layers.

3. The semiconductor device according to claim 1, wherein the semiconductor device comprises a semiconductor memory device.

4. The semiconductor device according to claim 1, wherein the second conductive layer comprises a U-shape structure.

5. The semiconductor device according to claim 1, wherein the cell-type power decoupling capacitor is on a resistor that is disposed in the substrate.

6. The semiconductor device according to claim 1, wherein the cell-type power decoupling capacitor is on a poly-silicon layer disposed in the substrate.

7. A semiconductor device, comprising:
a substrate;
an internal circuit in the substrate; and
a cell-type power decoupling capacitor on the internal circuit, the cell-type power decoupling capacitor stabilizing a supply voltage to provide the stabilized supply voltage to the internal circuit;
wherein the cell-type power decoupling capacitor comprises:
a first conductive layer connected to a first supply voltage;
a second conductive layer connected to a second supply voltage that is lower than the first supply voltage, and separated from the first conductive layer; and
a dielectric layer disposed between the first conductive layer and the second conductive layer,
wherein the cell-type power decoupling capacitor is on an N-type well or a P-type well, the N-type well or the P-type well disposed in the substrate.

8. The semiconductor device according to claim 1, wherein the cell-type power decoupling capacitor is on areas between CMOS transistor arrays.

9. The semiconductor device according to claim 8, wherein the cell-type power decoupling capacitor is on areas between two adjacent CMOS transistor arrays.

10. The semiconductor device according to claim 8, wherein the cell-type power decoupling capacitor is on areas between every N CMOS transistor arrays, wherein N is an integer equal to or larger than two.

11. The semiconductor device according to claim 1, wherein the cell-type power decoupling capacitor is under a metal fuse.

12. The semiconductor device according to claim 1, wherein the cell-type power decoupling capacitor is under a pad metal.

13. The semiconductor device according to claim 1, wherein the cell-type power decoupling capacitor is on a poly-silicon layer, the poly-silicon layer comprising a pumping capacitor.

14. A semiconductor device, comprising:
a substrate;
a plurality of first circuit elements in the substrate;
a plurality of power decoupling capacitor cells on the plurality of first circuit elements, remote from the substrate; and
a plurality of second circuit elements on the plurality of power decoupling capacitor cells, remote from the plurality of first circuit elements.

15. The semiconductor device according to claim 14, wherein the plurality of first circuit elements comprise a plurality of N-type transistors, a plurality of P-type transistors, a plurality of CMOS transistors, a plurality of resistors and/or a plurality of pumping capacitors.

16. The semiconductor device according to claim 14, wherein the plurality of second circuit elements comprise a plurality of pads and/or a plurality of fuses.

17. The semiconductor device according to claim 14, wherein the plurality of power decoupling capacitor cells comprise a plurality of electrodes that extend along a face of the substrate and also extend orthogonal to the face of the substrate.

18. The semiconductor device according to claim 14, wherein the plurality of power decoupling capacitor cells comprise first and second poly-silicon layers with a dielectric layer therebetween.

* * * * *